US007609521B2

(12) United States Patent
Wu

(10) Patent No.: US 7,609,521 B2
(45) Date of Patent: Oct. 27, 2009

(54) HEAT DISSIPATION DEVICE WITH A HEAT PIPE

(75) Inventor: Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 118 days.

(21) Appl. No.: 11/861,680

(22) Filed: Sep. 26, 2007

(65) Prior Publication Data

US 2009/0080160 A1 Mar. 26, 2009

(51) Int. Cl.
*H05K 7/20* (2006.01)
*F28D 15/00* (2006.01)

(52) U.S. Cl. ............ 361/700; 361/679.47; 361/679.52; 361/703; 361/704; 361/709; 165/104.33; 165/185; 174/15.2

(58) Field of Classification Search ................................ 361/679.52–679.54, 687, 699–704, 709–710, 361/718–719; 165/80.4, 80.5, 104.33, 185; 174/15.2
See application file for complete search history.

(56) References Cited

U.S. PATENT DOCUMENTS

| | | | | |
|---|---|---|---|---|
| 6,163,073 A * | 12/2000 | Patel | ............................ | 257/712 |
| 6,373,700 B1 * | 4/2002 | Wang | ............................ | 361/698 |
| 6,793,011 B2 | 9/2004 | Armstrong et al. | | |
| 7,100,681 B1 * | 9/2006 | Wu et al. | ................ | 165/104.33 |
| 7,333,332 B2 * | 2/2008 | Wang | ............................ | 361/700 |
| 7,343,962 B2 * | 3/2008 | Xia et al. | .................... | 165/80.3 |
| 7,443,680 B1 * | 10/2008 | Peng et al. | .................... | 361/704 |
| 7,451,806 B2 * | 11/2008 | Zhou et al. | .............. | 165/104.33 |
| 7,487,825 B2 * | 2/2009 | Yu et al. | ...................... | 165/185 |
| 7,493,939 B2 * | 2/2009 | Xia et al. | ................ | 165/104.26 |
| 2006/0045737 A1 * | 3/2006 | Wung et al. | .................. | 415/220 |
| 2006/0181849 A1 * | 8/2006 | Wang | .......................... | 361/700 |
| 2007/0074857 A1 * | 4/2007 | Xia et al. | ................ | 165/104.33 |
| 2007/0107876 A1 * | 5/2007 | Xia et al. | ................ | 165/104.26 |
| 2007/0211432 A1 * | 9/2007 | Peng et al. | ................... | 361/700 |
| 2007/0215321 A1 * | 9/2007 | Yang et al. | ................. | 165/80.3 |
| 2008/0093052 A1 * | 4/2008 | Yang et al. | ................. | 165/80.3 |
| 2008/0158820 A1 * | 7/2008 | Peng et al. | ................... | 361/703 |
| 2008/0173430 A1 * | 7/2008 | Jin et al. | ................. | 165/104.33 |
| 2008/0173431 A1 * | 7/2008 | Yang et al. | ............. | 165/104.33 |
| 2008/0216990 A1 * | 9/2008 | Min et al. | ................... | 165/80.3 |
| 2008/0289798 A1 * | 11/2008 | Min et al. | ................... | 165/80.3 |
| 2008/0289799 A1 * | 11/2008 | Luo et al. | ................... | 165/80.3 |
| 2008/0310122 A1 * | 12/2008 | Chou et al. | ................. | 361/720 |

(Continued)

*Primary Examiner*—Jayprakash N Gandhi
*Assistant Examiner*—Robert Hoffberg
(74) *Attorney, Agent, or Firm*—Frank R. Niranjan

(57) ABSTRACT

A heat dissipation device includes a fin assembly, a base, a heat pipe soldered with the base, and a heat spreader sandwiched between the heat pipe and the fin assembly. The fin assembly has a bottom face. The base has a bottom surface and a top surface. The heat pipe comprises an evaporation portion thermally engaging with the top surface of the base plate and a curved portion extending from the evaporation portion and projecting beyond the base plate. The heat spreader has a first face engaging with the bottom face of the fin assembly and a second face thermally engaging with the condensation portion of the heat pipe. The heat spreader has a profile on the bottom face of the fin assembly, which is in compliance with at least a portion of the heat pipe.

16 Claims, 6 Drawing Sheets

U.S. PATENT DOCUMENTS

2009/0000768 A1* 1/2009 Zheng et al. ............... 165/80.3
2009/0008065 A1* 1/2009 Jin et al. ................ 165/104.33
2009/0016023 A1* 1/2009 Cao et al. ................... 361/702

* cited by examiner

HEAT DISSIPATION DEVICE WITH A HEAT PIPE

BACKGROUND OF THE INVENTION

1. Field of the Invention

The present invention generally relates to heat dissipation devices, and more particularly to a heat dissipation device having a heat pipe for cooling an electronic component, such as an integrated circuit package.

2. Description of Related Art

Electronic components, such as central processing units (CPUs), comprise numerous circuits operating at high speed and generating substantial heat. Under most circumstances, it is necessary to cool the CPUs in order to maintain safe operating conditions and assure that the CPUs function properly and reliably. In the past, various approaches have been used to cool electronic components. Typically, a heat dissipation device is attached to an outer surface of a CPU to remove the heat therefrom.

A typical heat dissipation device generally comprises a base for absorbing heat from an electronic device, a heat pipe thermally combined to the base, and a plurality of fins arranged on the base. The base defines a groove receiving the heat pipe therein. In use, the base contacts the electronic device and absorbs heat from the electronic device. The heat in the base is absorbed by the heat pipe, and the heat pipe transfers the heat from a center of the base to other parts of the base. The heat in the base spreads to the fins to be dissipated to ambient air. However, since the base is large, the heat dissipation device has a large weight and high cost. Another heat dissipation device uses a small base and a heat pipe directly contacting a plurality of fins. However, a thermal contact area between the fins and the heat pipe is considerably small, which results in an unsatisfied heat dissipation performance of the another heat dissipation device. Therefore, the heat dissipation device needs to be improved.

Accordingly, what is needed is a heat dissipation device which has an enhanced heat dissipation performance and a low weight and cost.

SUMMARY OF THE INVENTION

According to an embodiment of the present invention, a heat dissipation device includes a fin assembly, a base, a heat pipe soldered to the base, and a heat spreader sandwiched between the heat pipe and the fin assembly. The fin assembly has a bottom face. The base has a bottom surface and a top surface. The heat pipe comprises an evaporation portion thermally engaging with the top surface of the base plate and a curved portion extending from the evaporation portion and projecting beyond the base plate. The heat spreader has a first face engaging with the bottom face of the fin assembly and a second face thermally engaging with the heat pipe, wherein the heat spreader has a profile on the bottom surface of the fin assembly, which is in compliance with that of the heat pipe.

Other advantages and novel features will become more apparent from the following detailed description of preferred embodiment when taken in conjunction with the accompanying drawings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
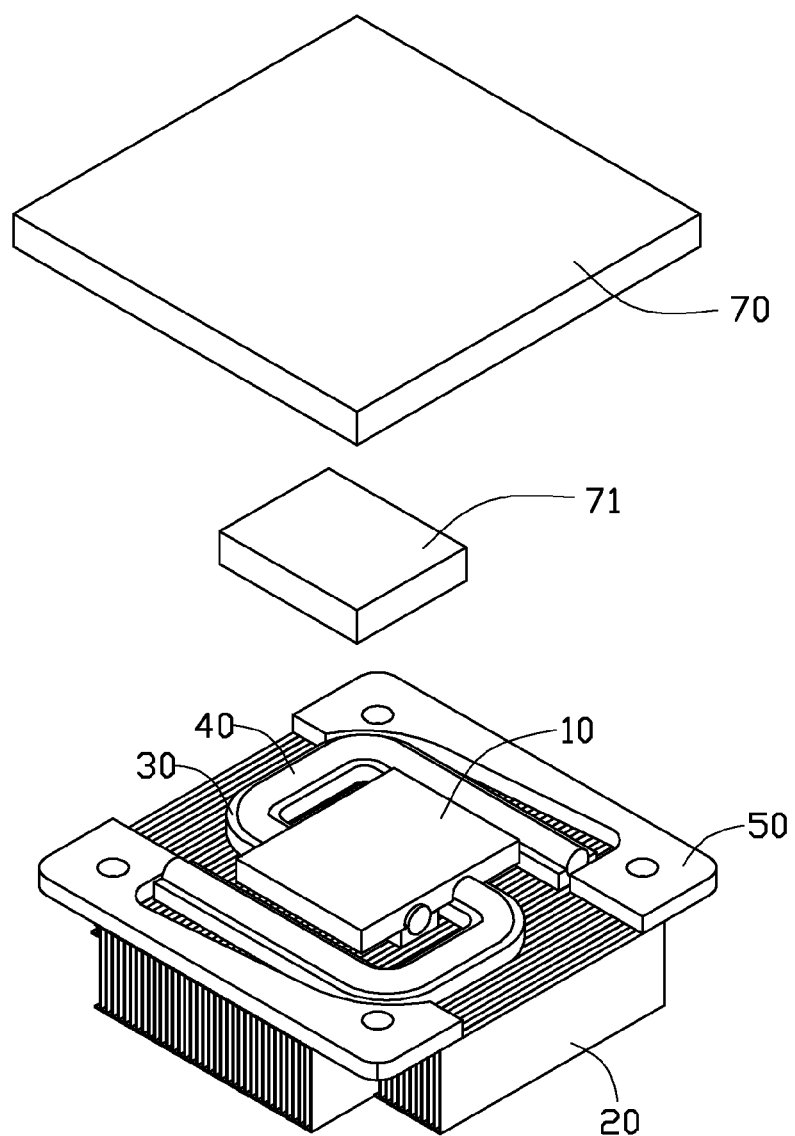
FIG. 1 is an assembled, isometric view of a heat dissipation device in accordance with a preferred embodiment of the present invention.
Figure 2:
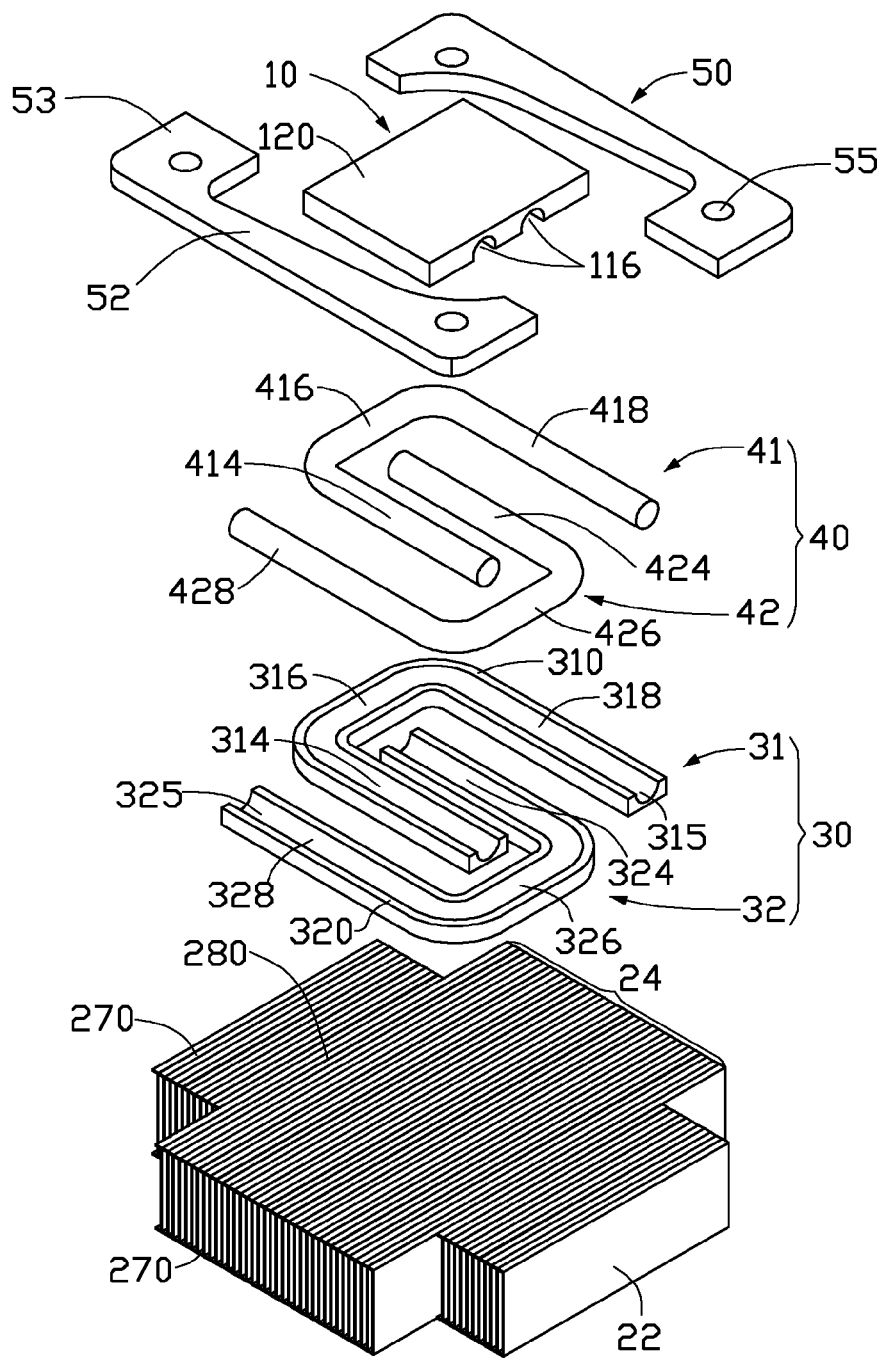
FIG. 2 is an exploded view of FIG. 1.
Figure 3:
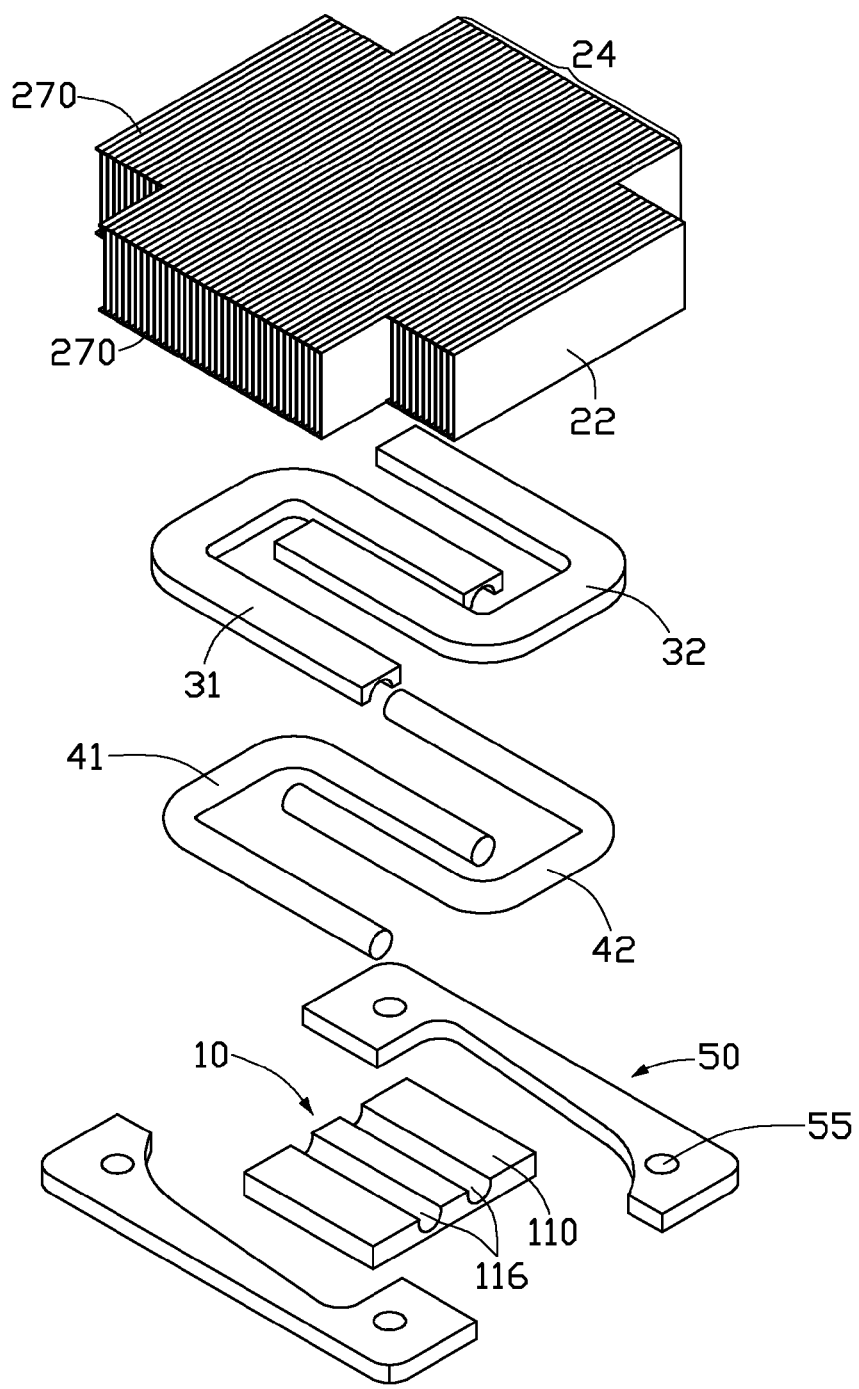
FIG. 3 is an inverted view of FIG. 2.

Referring to FIGS. 1-3, a heat dissipation device in accordance with a first embodiment of the present invention is shown. The heat dissipation device is for being mounted to a printed circuit board 70 to remove heat from a heat-generating electronic component mounted on the printed circuit board 70, such as a CPU 71. The heat dissipation device comprises a base plate 10 for contacting the CPU 71, a fin assembly 20, a heat spreader unit 30 soldered on a bottom of the fin assembly 20 and a heat pipe unit 40 thermally sandwiched between the base plate 10 and the heat spreader unit 30. The heat dissipation device further comprises two locking members 50 soldered to two opposite sides of the bottom of the fin assembly 20. The locking members 50 are provided for securing the heat dissipation device to the printed circuit board 70.

The base plate 10 is a substantially rectangular and thin plate, and is made of highly thermal conductive material such as copper or aluminum. The base plate 10 has a top surface 110 supporting the heat pipe unit 40 and a flat bottom surface 120 for directly contacting the CPU 71 to absorb heat therefrom. The base plate 10 defines two parallel straight grooves 116 in the top surface 110 thereof, for receiving the heat pipe unit 40 therein. In this embodiment, the base plate 10 is larger than the CPU 71 and smaller than the bottom of the fin assembly 20.

The fin assembly 20 comprises a plurality of first fins 22 and a plurality of second fins 24. The fin assembly 20 has the second fins 24 at a middle portion thereof and the first fins 22 at two opposite lateral portions thereof. The second fins 24 are longer than the first fins 22 so that front and rear end portions (not labeled) of the second fins 24 are located beyond front and rear end portions of the first fins 22, respectively. The first and second fins 22, 24 each are made of a thin metal plate and parallel to each other. The fin assembly 20 defines four cutouts (not labeled) at four corners of the fin assembly 20. Each of the first and the second fins 22, 24 forms flanges 270 perpendicularly extending from a top edge and a bottom edge thereof. In the fin assembly 20, the flanges 270 forms a flat top face (not labeled) and a flat bottom face 280.

The heat spreader unit 30 comprises a first heat spreader 31 and a second heat spreader 32. The first and second heat spreaders 31, 32 each are curved to have a U-shaped profile consisting of two L-shaped portions (not labeled). The first and second heat spreaders 31, 32 each have a flat top face (not labeled) engaged with the bottom face 280 of the fin assembly 20 and a bottom face 310, 320. The first and second heat spreaders 31, 32 each define a U-shaped groove 315, 325 at the bottom face 310, 320 thereof. The first heat spreader 31 comprises two separate parallel first, second sections 314, 318 and a connecting section 316 connecting with the first, second sections 314, 318. The second heat spreader 32 has a configuration similar to that of the first heat spreader 31, comprising two parallel first, second sections 324, 328 and a connecting section 326. The second sections 318, 328 are longer than the first sections 314, 324 of the first, second heat spreaders 31, 32.

The heat pipe unit 40 comprises a first heat pipe 41 and a second heat pipe 42 thermally sandwiched between the heat spreader unit 30 and the base plate 10. The first heat pipe 41 has a U-shaped configuration corresponding to that of the first heat spreader 31. The first heat pipe 41 comprises an evaporation portion 414, a condensation portion 418 and a connecting portion 416 connecting the evaporation portion 414 and the condensation portion 418. The second heat pipe 42 has a configuration similar to that of the first heat pipe 41 and corresponding to that of the second heat spreader 32. The second heat pipe 42 comprises an evaporation portion 424, a condensation portion 428 and a connecting portion 426. The condensation portions 418, 428 are longer than the evaporation portions 414, 424. A width of each section of the first and second heat spreaders 31, 32 is less than three times of a diameter of the first and second heat pipes 41, 42.

Each locking member 50 is made of a thin plate and has a substantially [-shaped configuration. Each locking member 50 comprises a beam 52 and two fixing boards 53 substantially perpendicular extending two ends of the beam 52. The beam 52 has a slantwise inner rim inclined from one of the two fixing boards 53 to the other. Each fixing board 53 of each locking member 50 defines a through hole 55 therein for receiving a fastening member (not shown) to secure the heat dissipation device to the printed circuit board 70.

In assembly, the locking members 50 are soldered on two opposite sides of bottom face 280 of the fin assembly 20, wherein the through holes 55 of the locking members 50 are located corresponding to the cutouts at four corners of the fin assembly 20, respectively. The first and second heat spreaders 31, 32 are soldered to the fin assembly 20 with the top faces of heat spreader 31, 32 engaging with the bottom face 280 of the fin assembly 20. The first sections 314, 324 of the first, second heat spreaders 31, 32 are engaged with a middle of the bottom of the fin assembly 20, and the second sections 318, 328 are located close to the locking members 50. The first section 314 of the first heat spreader 31 is positioned between the first section 324 and the second section 328 of the second heat spreader 32, and adjacent to the first section 324. The sections 314, 318, 324, 328 of the first, second heat spreaders 31, 32 are perpendicular to the first and second fins 22, 24. The first, second heat spreaders 31, 32 are so arranged that they are opened to each other. The first and second heat pipes 41, 42 are thermally soldered in corresponding grooves 315, 325 of the first, second heat spreaders 31, 32, wherein the evaporation portions 414, 424 are soldered with the first sections 314, 324 of the first and second spreaders 31, 32, and the condensation portions 418, 428 are soldered with the second sections 318, 328 of the first and second spreaders 31, 32. The base plate 10 is soldered with the evaporation portions 414, 424 and the first sections 314, 324 of the first and second spreaders 31, 32. The grooves 116 of the base plate 10 receive the evaporation portions 414, 424 therein. The condensation portions 418, 428 project beyond two lateral sides of the base plate 10.

In used, the base plate 10 is attached to the CPU 71 with the bottom surface 120 in contact with the CPU 71. Heat generated by the CPU 71 is absorbed by the base plate 10. The heat in the base plate 10 is absorbed by the evaporation portions 414, 424 of the heat pipes 41, 42 engaging with the base plate 10, and is quickly and evenly transferred to the connecting and condensation portions 416, 426, 418, 428 of the first, second heat pipes 41, 42 engaging with the first and second heat spreaders 31, 32. The heat in the heat spreaders 31, 32 is transmitted to the fin assembly 20. The fin assembly 20 dissipates the heat to ambient air.

According to the first embodiment of the present invention, the heat spreader unit 30 has a configuration corresponding to that of the first heat pipe unit 40 to spread heat from the heat pipes unit 40 to the fin assembly 20, thus helping to reduce a weight and a cost of the heat dissipation device; simultaneously the heat spreader unit 30 has a flat top face engaged with the bottom face 280 of the fin assembly 20, and grooves 315, 325 thereof receiving the heat pipe unit 40, thus helping to adequately contact the fin assembly 20 and the heat pipe unit 40. Thus, the heat dissipation device can quickly transfer heat from the CPU 71 to the fin assembly 20 thereof.

Figure 4:
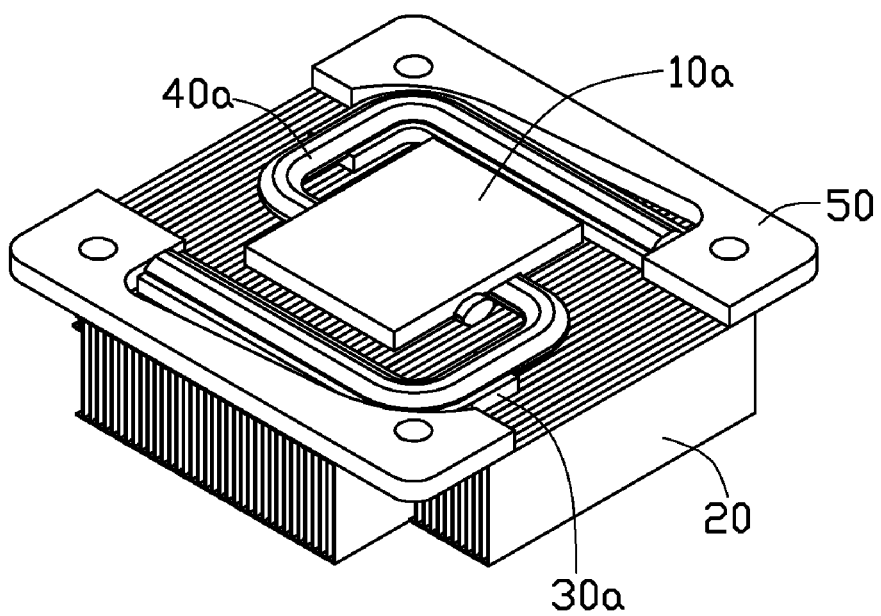
FIG. 4 is an assembled, isometric view of a heat dissipation device in accordance with a second embodiment of the present invention.
Figure 5:
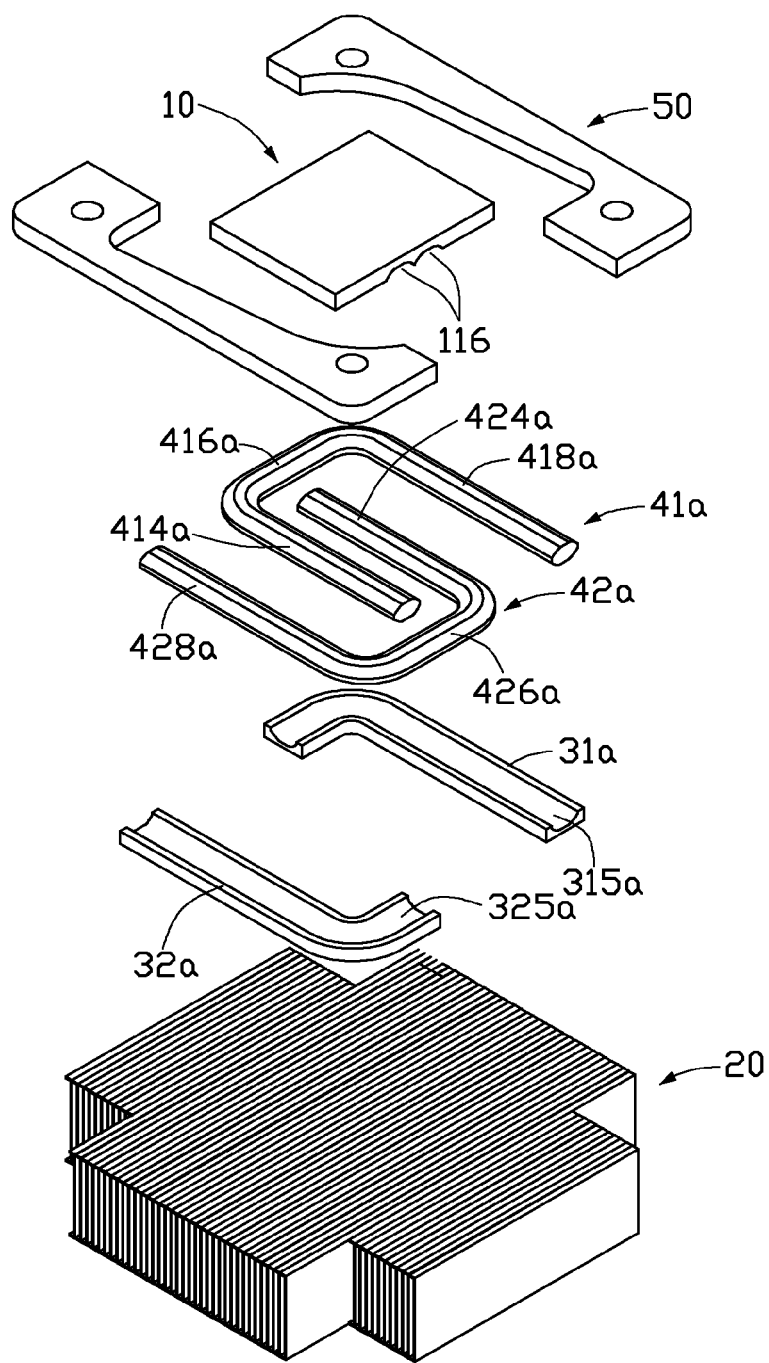
FIG. 5 is an exploded view of FIG. 4.
Figure 6:
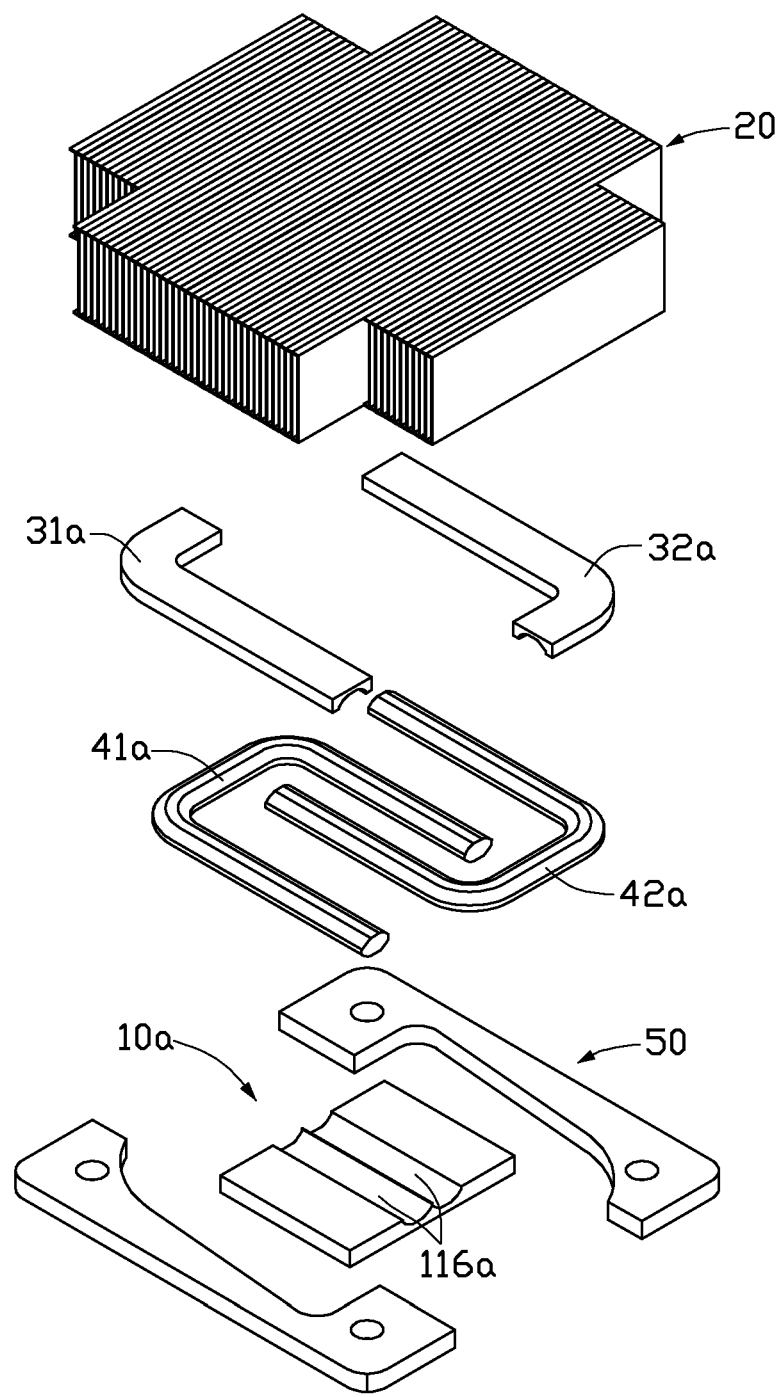
FIG. 6 is an inverted view of FIG. 5.

FIGS. 4-6 show a heat dissipation device of a second embodiment of the present invention. In this embodiment, the heat dissipation device comprises a base plate 10*a*, a fin assembly 20, a heat spreader unit 30*a*, a heat pipe unit 40*a* and two locking members 50, wherein the fin assembly 20 and locking members 50 have the same configuration as the first embodiment. The heat pipe unit 40*a* is similar to the heat pipe unit 40 in the first embodiment and comprises first and second heat pipes 41*a*, 42*a*. The first and second heat pipes 41*a*, 42*a* comprise evaporation portions 414*a*, 424*a*, condensation portions 418*a*, 428*a* and connecting portions 416*a*, 426*a*. The portions 414*a*, 424*a*, 418*a*, 428*a*, 416*a*, 426*a* of the heat pipes 41*a*, 42*a* have flat faces contacting the base plate 10*a*, the heat spreader unit 30*a* and the fin assembly 20. The base plate 10*a* is similar to the base plate 10 in the first embodiment and has two grooves 116*a* for receiving the evaporation portions 414*a*, 424*a*. Each groove 116*a* has a flat bottom contacting a corresponding flat face of each of the evaporation portions 414*a*, 424*a* of the heat pipe unit 40*a*. The heat spreader unit 30*a* is soldered with a bottom of the fin assembly 20 and comprises a first heat spreader 31*a* and a second heat spreader 32*a*. The first and second heat spreaders 31*a*, 32*a* each are curved to define an L-shaped configuration. The first and second heat spreaders 31*a*, 32*a* are located close to the locking members 50, respectively. The first heat spreader 31*a* has a groove 315*a* thermally receiving the condensation portion 418*a* and a part of the connecting portion 416*a*. The second heat spreader 32*a* has a groove 325*a* thermally receiving the condensation portion 428*a* and a part of the connecting portion 426*a*.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a fin assembly comprising a plurality of fins having a bottom face at a bottom thereof;
   a base plate being smaller than the bottom face of the fin assembly, having a first surface adapted for contacting with a heat-generating electronic component and a second surface opposite to the first surface;
   a heat pipe comprising an evaporation portion thermally engaging with the second surface of the base plate, and a curved portion extending from the evaporation portion and projecting beyond the base plate; and
   a heat spreader being curved and comprising a curved section thereof having a profile similar to the curved portion of the heat pipe, the curved section having a first face engaging with the bottom face of the fin assembly and a second face thermally engaging with the curved portion of the heat pipe;

wherein the heat spreader defines a groove at the second face thereof, the groove thermally receiving the curved portion of the heat pipe therein;

wherein the curved portion of the heat pipe is L-shaped, the curved section of the heat spreader is L-shaped corresponding to the curved portion of the heat pipe;

wherein the heat pipe is U-shaped, the curved portion of the heat pipe comprises a condensation portion parallel to the evaporating portion of the heat pipe and a connecting section connecting the evaporation portion and the condensation portion;

wherein the heat spreader comprises an additional section extending from the curved section thereof and cooperating with the curved section to define a U-shaped profile, the evaporation portion of the heat pipe is sandwiched between the additional section of the heat spreader and the base plate.

2. The heat dissipation device as described in claim 1, wherein the evaporation portion of the heat pipe extends beyond the heat spreader.

3. The heat dissipation device as described in claim 1, further comprising an additional heat pipe similar to the heat pipe, wherein the additional heat pipe is so oriented that it opens to a direction opposite to that of the heat pipe.

4. The heat dissipation device as described in claim 3, further comprising an additional heat spreader matching the additional heat pipe, wherein the additional heat spreader is sandwiched between the fin assembly and the additional heat pipe and thermally contacts the additional heat pipe.

5. The heat dissipation device as described in claim 1, further comprising two locking members soldered on two opposite sides of the bottom of the fin assembly.

6. The heat dissipation device as described in claim 5, wherein each of the two locking members comprises a beam and two fixing boards extending from two ends of the beam, each board defining a fixing hole, the fin assembly defining four cutouts at four corners thereof corresponding to the fixing holes, respectively.

7. A heat dissipation device for an electronic component, comprising:
    a fin assembly having a bottom face;
    a heat spreader attached to the bottom face of the fin assembly;
    a heat pipe having at least a portion being attached to the heat spreader; and
    a base plate having a first face attached to an evaporation portion of the heat pipe and an opposite second face adapted for contacting with the electronic component;
    wherein the heat spreader has a profile on the bottom face of the fin assembly which is substantially the same as that of the heat pipe in whole.

8. The heat dissipation device as described in claim 7 further comprising at least a locking member attached to the bottom surface of the fin assembly, wherein the fin assembly defines four cutouts in four corners thereof, respectively, the at least a locking member having four through holes located corresponding to the four cutouts, respectively.

9. The heat dissipation device as described in claim 7, wherein the base plate defines a groove in the first face thereof, the groove receiving the evaporation portion of the heat pipe therein.

10. The heat dissipation device as described in claim 7, wherein the evaporation portion of the heat pipe is sandwiched between the heat spreader and the base plate and thermally contacts the heat spreader.

11. The heat dissipation device as described in claim 7, wherein the heat spreader is sandwiched between the fin assembly and the heat pipe.

12. The heat dissipation device as described in claim 7, wherein the heat pipe is U-shaped and the heat spreader has a U-shaped configuration.

13. A heat dissipation device comprising:
    a fin assembly comprising a plurality of fins having a bottom face at a bottom thereof;
    a base plate being smaller than the bottom face of the fin assembly, having a first surface adapted for contacting with a heat-generating electronic component and a second surface opposite to the first surface;
    a heat pipe comprising an evaporation portion thermally engaging with the second surface of the base plate, and a curved portion extending from the evaporation portion and projecting beyond the base plate;
    a heat spreader being curved and comprising a curved section thereof having a profile similar to the curved portion of the heat pipe, the curved section having a first face engaging with the bottom face of the fin assembly and a second face thermally engaging with the curved portion of the heat pipe;
    an additional heat pipe similar to the heat pipe, wherein the additional heat pipe is so oriented that it opens to a direction opposite to that of the heat pipe; and
    an additional heat spreader matching the additional heat pipe, wherein the additional heat spreader is sandwiched between the fin assembly and the additional heat pipe and thermally contacts the additional heat pipe;
    wherein the heat spreader defines a groove at the second face thereof, the groove thermally receiving the curved portion of the heat pipe therein;
    wherein the curved portion of the heat pipe is L-shaped, the curved section of the heat spreader is L-shaped corresponding to the curved portion of the heat pipe; and
    wherein the heat pipe is U-shaped, the curved portion of the heat pipe comprises a condensation portion parallel to the evaporating portion of the heat pipe and a connecting section connecting the evaporation portion and the condensation portion.

14. The heat dissipation device as described in claim 13, wherein the evaporation portion of the heat pipe extends beyond the heat spreader.

15. The heat dissipation device as described in claim 13, further comprising two locking members soldered on two opposite sides of the bottom of the fin assembly.

16. The heat dissipation device as described in claim 15, wherein each of the two locking members comprises a beam and two fixing boards extending from two ends of the beam, each board defining a fixing hole, the fin assembly defining four cutouts at four corners thereof corresponding to the fixing holes, respectively.

* * * * *